US011569362B2

(12) United States Patent
Hsu et al.

(10) Patent No.: US 11,569,362 B2
(45) Date of Patent: Jan. 31, 2023

(54) SEMICONDUCTOR DEVICE AND A METHOD FOR FABRICATING THE SAME

(71) Applicant: TAIWAN SEMICONDUCTOR MANUFACTURING CO., LTD., Hsinchu (TW)

(72) Inventors: Chia-Ming Hsu, Hualien County (TW); Pei-Yu Chou, Hsinchu County (TW); Chih-Pin Tsao, Zhubei (TW); Kuang-Yuan Hsu, Taichung (TW); Jyh-Huei Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 150 days.

(21) Appl. No.: 16/927,953

(22) Filed: Jul. 13, 2020

(65) Prior Publication Data

US 2020/0350416 A1 Nov. 5, 2020

Related U.S. Application Data

(62) Division of application No. 16/049,589, filed on Jul. 30, 2018, now Pat. No. 10,714,586, which is a (Continued)

(51) Int. Cl.
*H01L 29/66* (2006.01)
*H01L 29/45* (2006.01)
(Continued)

(52) U.S. Cl.
CPC ........ *H01L 29/45* (2013.01); *H01L 21/32053* (2013.01); *H01L 21/76802* (2013.01); (Continued)

(58) Field of Classification Search
CPC ............... H01L 29/45; H01L 21/32053; H01L 21/76802; H01L 21/76832; (Continued)

(56) References Cited

U.S. PATENT DOCUMENTS 4,822,642 A 4/1989 Cabrera et al.
6,153,517 A 11/2000 Chuang et al.
(Continued)

FOREIGN PATENT DOCUMENTS

CN 103426739 A 12/2013
JP H06-124915 A 5/1994
(Continued)

OTHER PUBLICATIONS

Suguru Noda et al., "Selective Silicidation of Co Using Silane or Disilane for AntiOxidation Barrier Layer in Cu Metallization", Japanese Journal of Applied Physics, vol. 43, No. 9A, Sep. 2004, pp. 6001-6007.

(Continued)

*Primary Examiner* — Bitew A Dinke
(74) *Attorney, Agent, or Firm* — McDermott Will & Emery LLP

(57) ABSTRACT

A semiconductor device includes a source/drain region, a source/drain silicide layer formed on the source/drain region, and a first contact disposed over the source/drain silicide layer. The first contact includes a first metal layer, an upper surface of the first metal layer is at least covered by a silicide layer, and the silicide layer includes a same metal element as the first metal layer.

20 Claims, 12 Drawing Sheets

110
90
80
70
75

Related U.S. Application Data division of application No. 15/378,574, filed on Dec. 17, 2016, now Pat. No. 10,153,351.

(60) Provisional application No. 62/289,148, filed on Jan. 29, 2016.

(51) Int. Cl.

*H01L 23/485* (2006.01)
*H01L 21/768* (2006.01)
*H01L 29/417* (2006.01)
*H01L 23/532* (2006.01)
*H01L 21/3205* (2006.01)
*H01L 21/8234* (2006.01)
*H01L 27/088* (2006.01)
*H01L 21/285* (2006.01)
*H01L 29/78* (2006.01)
*H01L 21/02* (2006.01)

(52) U.S. Cl.

CPC .. *H01L 21/76832* (2013.01); *H01L 21/76834* (2013.01); *H01L 21/76849* (2013.01); *H01L 21/76867* (2013.01); *H01L 21/76877* (2013.01); *H01L 21/76889* (2013.01); *H01L 21/76897* (2013.01); *H01L 21/823418* (2013.01); *H01L 23/485* (2013.01); *H01L 23/53209* (2013.01); *H01L 23/53238* (2013.01); *H01L 23/53266* (2013.01); *H01L 27/0886* (2013.01); *H01L 29/41791* (2013.01); *H01L 29/665* (2013.01); *H01L 29/66795* (2013.01); *H01L 21/0214* (2013.01); *H01L 21/0217* (2013.01); *H01L 21/02167* (2013.01); *H01L 21/28518* (2013.01); *H01L 21/76805* (2013.01); *H01L 21/76843* (2013.01); *H01L 21/76855* (2013.01); *H01L 29/7848* (2013.01)

(58) Field of Classification Search

CPC ......... H01L 21/76834; H01L 21/76849; H01L 21/76867; H01L 21/76877; H01L 21/76889; H01L 21/76897; H01L 21/823418; H01L 23/485; H01L 23/53209; H01L 23/53238; H01L 23/53266; H01L 27/0886; H01L 29/41791; H01L 29/665; H01L 29/66795; H01L 21/0214; H01L 21/02167; H01L 21/0217; H01L 21/28518; H01L 21/76805; H01L 21/76843; H01L 21/76855; H01L 29/7848; H01L 29/456; H01L 29/785; H01L 21/28052; H01L 21/28061; H01L 21/32051; H01L 29/0649; H01L 29/408; H01L 29/41725

See application file for complete search history.

(56) References Cited

U.S. PATENT DOCUMENTS 7,180,143 B2 2/2007 Kanegae et al.
8,962,490 B1 2/2015 Hung et al.
9,548,366 B1 1/2017 Ho et al.
10,153,351 B2* 12/2018 Hsu ........................ H01L 29/665
10,714,586 B2* 7/2020 Hsu ..................... H01L 27/0886
2002/0022357 A1 2/2002 Iijima et al.
2002/0105089 A1 8/2002 Tanaka
2004/0130030 A1 7/2004 Kunimune et al.
2004/0238963 A1* 12/2004 Fujisawa ........... H01L 21/76858 257/E21.591
2005/0275110 A1 12/2005 Maekawa et al.
2006/0125100 A1* 6/2006 Arakawa ........... H01L 21/76847 257/E23.145
2006/0157854 A1 7/2006 Takewaki et al.
2006/0163642 A1 7/2006 Widdershoven et al.
2007/0082488 A1* 4/2007 Katou ............... H01L 21/76886 257/455
2007/0111522 A1* 5/2007 Lim .................. H01L 21/76849 257/E21.585
2007/0182014 A1* 8/2007 Usami ............... H01L 21/76832 257/E21.582
2007/0212809 A1* 9/2007 Ohto ................. H01L 21/76834 438/421
2007/0281461 A1 12/2007 Jang
2008/0032480 A1 2/2008 Gonzalez et al.
2008/0079090 A1 4/2008 Hwang et al.
2008/0233734 A1* 9/2008 Ohara ............... H01L 21/76834 438/618
2009/0218691 A1* 9/2009 Yang ................... H01L 23/5226 438/653
2010/0129974 A1 5/2010 Futase et al.
2010/0164111 A1* 7/2010 Yang ................. H01L 21/76814 257/E23.141
2010/0164123 A1* 7/2010 Letz .................. H01L 21/76826 257/E21.585
2011/0215387 A1 9/2011 Bissey et al.
2012/0146106 A1 6/2012 Richter et al.
2013/0049219 A1 2/2013 Tsai et al.
2013/0171818 A1 7/2013 Kim et al.
2013/0244422 A1 9/2013 Zhang et al.
2013/0307032 A1 11/2013 Kamineni et al.
2013/0316535 A1 11/2013 Shin et al.
2014/0091467 A1* 4/2014 Jezewski ........... H01L 21/76883 438/653
2014/0191312 A1 7/2014 Kim et al.
2014/0239503 A1 8/2014 Huisinga et al.
2014/0327140 A1 11/2014 Zhang et al.
2015/0076500 A1 3/2015 Sakaida et al.
2015/0123279 A1 5/2015 Chi et al.
2015/0171206 A1 6/2015 van Dal
2015/0235948 A1 8/2015 Song et al.
2015/0249038 A1* 9/2015 Xu .................... H01L 21/76858 438/653
2015/0279733 A1 10/2015 Ferrer et al.
2016/0043035 A1 2/2016 Lin et al.
2016/0126135 A1* 5/2016 Zhang ............... H01L 21/76802 438/655
2016/0126190 A1* 5/2016 Zhang ............... H01L 21/76883 438/653
2016/0379878 A1* 12/2016 Anderson ......... H01L 21/76802 257/754
2017/0148662 A1 5/2017 Ok et al.
2017/0148669 A1 5/2017 Kamineni et al.
2017/0170068 A1 6/2017 Pranatharthiharan et al.
2017/0213792 A1 7/2017 Nag et al.

FOREIGN PATENT DOCUMENTS

JP 2010034490 A 2/2010
JP 4449374 B2 4/2010
KR 10-2013-0131755 A 1/2008
KR 10-0791345 B1 1/2008
KR 10-2014-0089673 A 7/2014

OTHER PUBLICATIONS

Office Action dated Jul. 17, 2017, in Korean Patent Application No. 10-2017-0006010.

Korean Notice of Final Rejection issued in corresponding Korean Patent Application No. 10-2017-0006010, dated Apr. 6, 2018, with English Translation.

Korean Decision of Rejection for Amendment issued in corresponding Korean Patent Application No. 10-2017-0006010, dated Apr. 6, 2018, with English Translation.

Office Action issued in correspondin Taiwanese Application No. 106103214, dated Nov. 3, 2017.

Korean Office Action issued in corresponding Korean Appliation No. 10-2017-0006010, dated Jan. 30, 2018.

(56) References Cited

OTHER PUBLICATIONS

Office Action issued in Korean Application No. 10-2018-0073307 dated Jul. 17, 2018.
Non-Final Office Action issued in U.S. Appl. No. 16/049,589, dated Aug. 21, 2019.
Final Office Action issued in U.S. Appl. No. 16/049,589, dated Dec. 27, 2019.
Notice of Allowance issued in U.S. Appl. No. 16/049,589, dated Mar. 10, 2020.

* cited by examiner

33

SEMICONDUCTOR DEVICE AND A METHOD FOR FABRICATING THE SAME

CROSS-REFERENCE TO RELATED APPLICATIONS

This application is a Divisional Application of U.S. patent application Ser. No. 16/049,589 filed Jul. 30, 2018, now U.S. Pat. No. 10,714,586, which is a Divisional Application of U.S. patent application Ser. No. 15/378,574 filed Dec. 14, 2016, now U.S. Pat. No. 10,153,351, which claims priority to U.S. Provisional Patent Application 62/289,148 filed Jan. 29, 2016, the entire disclosure of each of which is incorporated herein by reference.

TECHNICAL FIELD

The disclosure relates to a method for manufacturing a semiconductor device, and more particularly to a structure and a manufacturing method for a conductive layer over source/drain regions.

BACKGROUND

With a decrease of dimensions of semiconductor devices, various metals other than aluminum and copper have been used. For example, cobalt (Co) has been used as a conductive material for a via or a contact structure. Since Co is an active metal and easily reacts with oxygen, moisture or acid, it is generally difficult to use Co in a stable manner.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term “made of” may mean either “comprising” or “consisting of.”

Figure 1A:
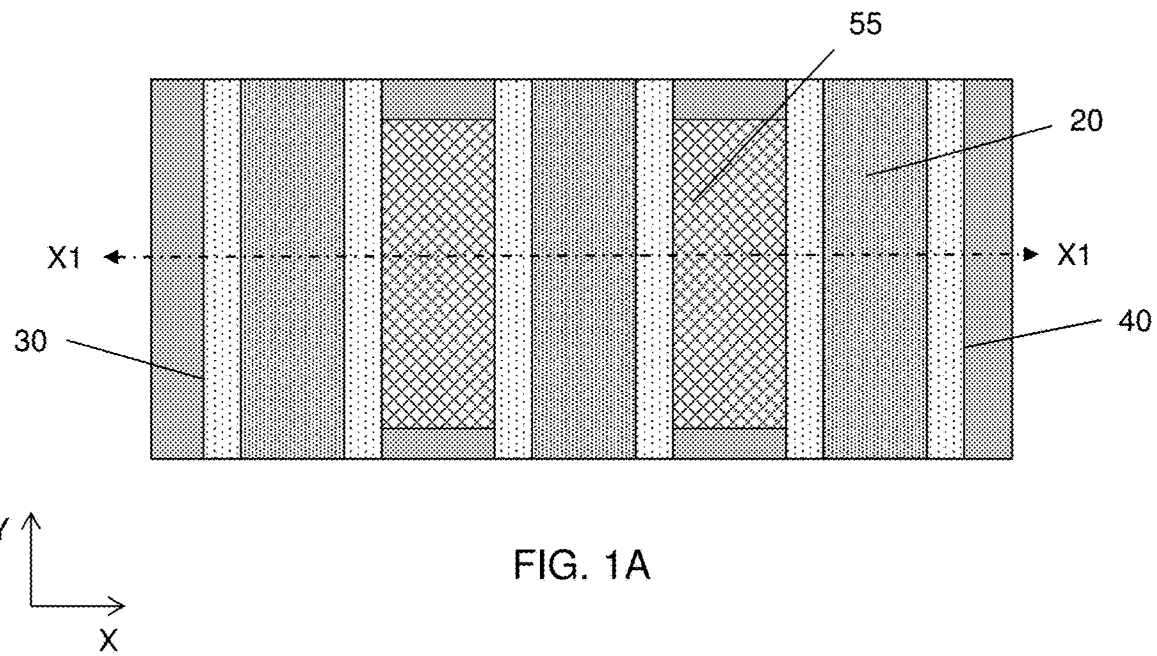
FIG. 1A shows an exemplary plan view (viewed from the above) illustrating one of the various stages of a sequential fabrication process of a semiconductor device according to one embodiment of the present disclosure.
Figure 1B:
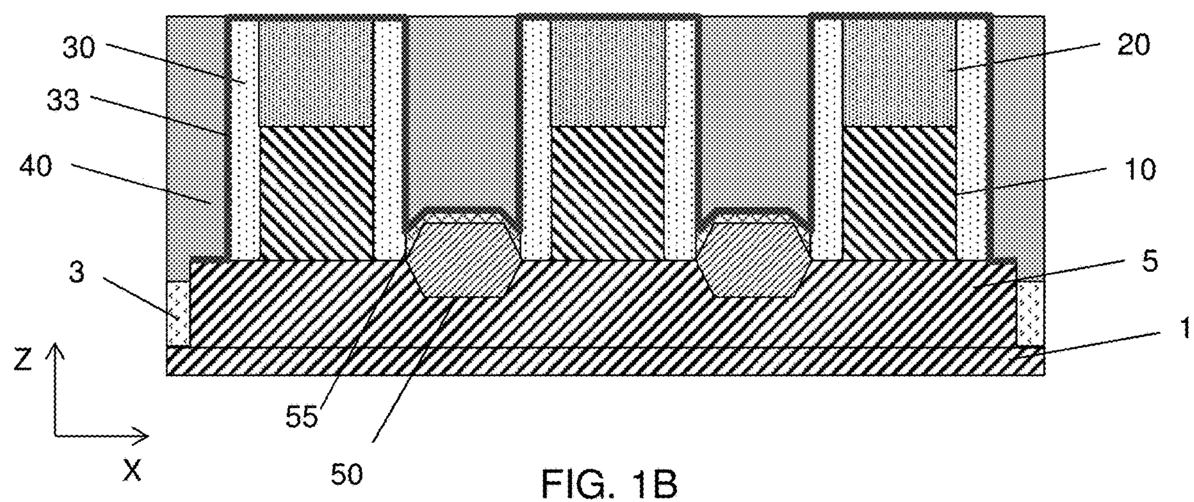
FIG. 1B shows an exemplary cross sectional view along line X1-X1 of FIG. 1A.

FIGS. 1A and 1B show one of the stages of a sequential fabrication process of a semiconductor device according to one embodiment of the present disclosure. FIG. 1A shows a plan (top) view and FIG. 1B shows a cross sectional view along line X1-X1 of FIG. 1A.

Figure 2:
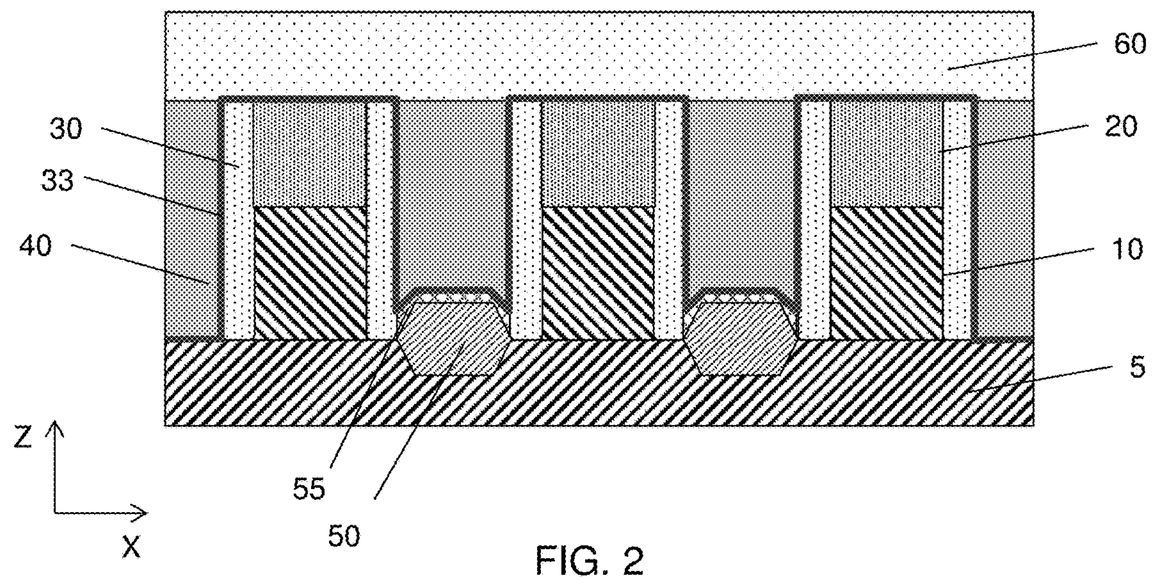
FIGS. 2-9 show exemplary cross sectional views corresponding to line X1-X1 of FIG. 1A illustrating various stages of the sequential fabrication process of a semiconductor device according to one embodiment of the present disclosure.

FIGS. 1A and 1B show a structure of a semiconductor device after metal gate structures are formed. In FIGS. 1A and 1B, metal gate structures 10 are formed over a channel layer, for example, a part of a fin structure 5, and cap insulating layers 20 are disposed over the metal gate structures 10. The fin structure 5 is disposed over a substrate 1 and protrudes from an isolation insulating layer 3. In FIG. 2 and thereafter, the substrate 1 and the isolation insulating layer 3 are omitted. The thickness of the metal gate structures 10 is in a range from 15 nm to 50 nm in some embodiments. The thickness of the cap insulating layer 20 is in a range from about 10 nm to about 30 nm in some embodiments, and is in a range from about 15 nm to about 20 nm in other embodiments. Sidewall spacers 30 are provided on sidewalls of the metal gate structure 10 and the cap insulating layer 20. The film thickness of the sidewall spacers 30 at the bottom of the sidewall spacers is in a range from about 3 nm to about 15 nm in some embodiments, and is in a range from about 4 nm to about 10 nm in other embodiments. The combination of the metal gate structure 10, the cap insulating layer 20 and sidewall spacers 30 may be collectively referred to as a gate structure. Further, source/drain (S/D) regions 50 are formed adjacent to the gate structures, and a contact etch stop layer (CESL) 33 is formed over the gate structure and the A/D regions 50. The film thickness of the CESL 33 is in a range from about 1 nm to about 20 nm in some embodiments. Spaces between the gate structures are filled with a first interlayer dielectric (ILD) layer 40. A silicide layer 55 is further formed on the S/D region 50. In the present disclosure, a source and drain are interchangeably used and there is substantially no structural difference. The term "a source/drain" (an S/D) refers to one of a source and a drain.

The silicide layer 55 includes one or more of cobalt silicide (e.g., CoSi, $CoSi_2$, $Co_2Si$, $Co_2Si$, $Co_3Si$; collectively "Co silicide"), titanium silicide (e.g., $Ti_5Si_3$, TiSi, $TiSi_2$, $TiSi_3$, $Ti_6Si_4$; collectively "Ti silicide"), nickel silicide (e.g., $Ni_3Si$, $Ni_{31}Si_{12}$, $Ni_2Si$, $Ni_3Si_2$, NiSi, $NiSi_2$; collectively "Ni silicide"), copper silicide (e.g., $Cu_{17}Si_3$, $Cu_{56}Si_{11}$, $Cu_5Si$, $Cu_{33}Si_7$, $Cu_4Si$, $Cu_{19}Si_6$, $Cu_3Si$, $Cu_{87}Si_{13}$; collectively "Cu silicide"), tungsten silicide ($W_5Si_3$, $WSi_2$; collectively "W silicide"), and molybdenum silicide ($Mo_3Si$, $Mo_5Si_3$, $MoSi_2$; collectively "Mo silicide").

Figure 1C:
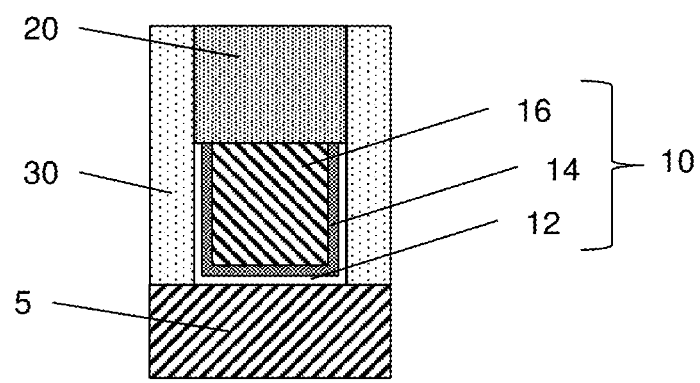
FIG. 1C is an enlarged view of the gate structure.

FIG. 1C is an enlarged view of the gate structure. The metal gate structure 10 includes one or more layers 16 of metal material, such as Al, Cu, W, Ti, Ta, TiN, TiAl, TiAlC, TiAlN, TaN, NiSi, CoSi, other conductive materials. A gate dielectric layer 12 disposed between the channel layer 5 and the metal gate includes one or more layers of metal oxides such as a high-k metal oxide. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, an interfacial layer made of $SiO_2$ having a 1-3 nm thickness is formed between the channel layer 5 and the high-k gate dielectric layer 12.

In some embodiments, one or more work function adjustment layers 14 are interposed between the gate dielectric layer 12 and the metal material 16. The work function adjustment layers 14 are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer.

The cap insulating layer 20 includes one or more layers of insulating material such as silicon nitride based material including SiN, SiCN and SiOCN. The sidewall spacer 30 is made of a different material than the cap insulating layer 20 and includes one or more layers of insulating material such as silicon nitride based material including SiN, SiON, SiCN and SiOCN. The CESL 33 is made of a different material than the cap insulating layer 20 and the sidewall spacers 30, and includes one or more layers of insulating material such as silicon nitride based material including SiN, SiON, SiCN and SiOCN. The first ILD layer 40 includes one or more layers of silicon oxide, SiOC, SiOCN or SiCN or other low-k materials, or porous materials. The first ILD layer 40 can be formed by LPCVD (low pressure chemical vapor deposition), plasma-CVD or other suitable film forming methods.

The material of the CESL 33, the sidewall spacer 30, the material of the cap insulating layer 20, and a material of the first ILD layer 40 may be different from each other, so that each of these layers can be selectively etched. In one embodiment, the CESL 33 is made of SiN, the sidewall spacer 30 is made of SiOCN, SiCN or SiON, the cap insulating layer 20 is made of SiN or SiON, and the first ILD 40 layer is made of $SiO_2$.

In this embodiment, fin field effect transistors (Fin FETs) fabricated by a gate-replacement process are employed.

Figure 1D:
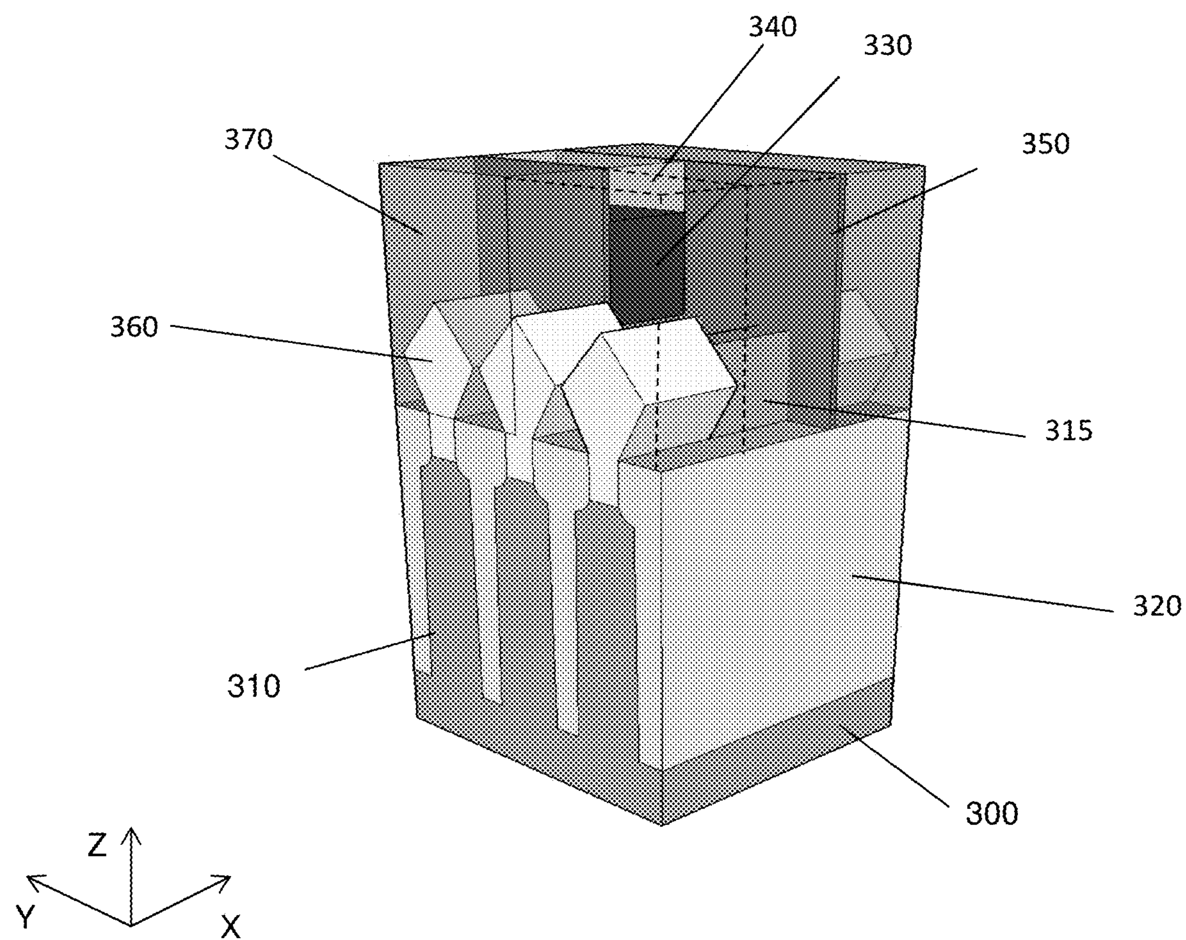
FIG. 1D shows an exemplary perspective view illustrating one of the various stages of a sequential fabrication process of a semiconductor device according to one embodiment of the present disclosure.

FIG. 1D shows an exemplary perspective view of a Fin FET structure. The Fin FET structure can be fabricated by the following operations.

First, a fin structure 310 is fabricated over a substrate 300. The fin structure includes a bottom region and an upper region as a channel region 315. The substrate is, for example, a p-type silicon substrate with an impurity concentration in a range from about $1\times10^{15}$ $cm^{-3}$ to about $1\times10^{18}$ $cm^{-3}$. In other embodiments, the substrate is an n-type silicon substrate with an impurity concentration in a range from about $1\times10^{15}$ $cm^{-3}$ to about $1\times10^{18}$ $cm^{-3}$. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on-insulator) substrate.

After forming the fin structure 310, an isolation insulating layer 320 is formed over the fin structure 310. The isolation insulating layer 320 includes one or more layers of insulating materials such as silicon oxide, silicon oxynitride or silicon nitride, formed by LPCVD, plasma-CVD or flowable CVD. The isolation insulating layer may be formed by one or more layers of spin-on-glass (SOG), SiO, SiON, SiOCN and/or fluorine-doped silicate glass (FSG).

After forming the isolation insulating layer 320 over the fin structure, a planarization operation is performed so as to remove part of the isolation insulating layer 320. The planarization operation may include a chemical mechanical polishing (CMP) and/or an etch-back process. Then, the isolation insulating layer 320 is further removed (recessed) so that the upper region of the fin structure is exposed.

A dummy gate structure is formed over the exposed fin structure. The dummy gate structure includes a dummy gate electrode layer made of poly silicon and a dummy gate dielectric layer. Sidewall spacers 350 including one or more layers of insulating materials are also formed on sidewalls of the dummy gate electrode layer. After the dummy gate structure is formed, the fin structure 310 not covered by the dummy gate structure is recessed below the upper surface of the isolation insulating layer 320. Then, a source/drain region 360 is formed over the recessed fin structure by using an epitaxial growth method. The source/drain region may include a strain material to apply stress to the channel region 315.

Then, an interlayer dielectric layer (ILD) 370 is formed over the dummy gate structure and the source/drain region. The ILD layer 370 includes one or more layers of silicon oxide, SiOC, SiOCN or SiCN or other low-k materials, or porous materials. After a planarization operation, the dummy gate structure is removed so as to make a gate space. Then, in the gate space, a metal gate structure 330 including a metal gate electrode and a gate dielectric layer, such as a high-k dielectric layer, is formed. Further, the cap insulating layer 340 is formed over the metal gate structure 330, so as to obtain the Fin FET structure shown in FIG. 1D. In FIG. 1D, parts of the metal gate structure 330, the cap isolation layer 340, sidewalls 330 and the ILD 370 are cut to show the underlying structure.

The metal gate structure 330, the cap isolation layer 340, sidewalls 330, source/drain 360 and the ILD 370 of FIG. 1D substantially correspond to the metal gate structures 10, cap insulating layers 20, sidewall spacers 30, source/drain regions 50 and first interlayer dielectric layer (ILD) 40, of FIGS. 1A and 1B, respectively.

FIGS. 2-9 show exemplary cross sectional views corresponding to line X1-X1 of FIG. 1A, illustrating various stages of the sequential fabrication process of a semiconductor device according to one embodiment of the present disclosure. It is understood that additional operations can be provided before, during, and after processes shown by FIGS. 2-9, and some of the operations described below can be replaced or eliminated for additional embodiments of the method. The order of the operations/processes may be interchangeable.

As shown in FIG. 2, a second ILD layer 60 is formed over the structure of FIG. 1B. The material and forming process are similar to those of the first ILD layer 40. In some embodiments, a contact etch stop layer (CESL) (not shown) made by, for example, SiN, SiC or SiCN, is formed between the first ILD layer 40 and the second ILD layer 60.

Figure 3:
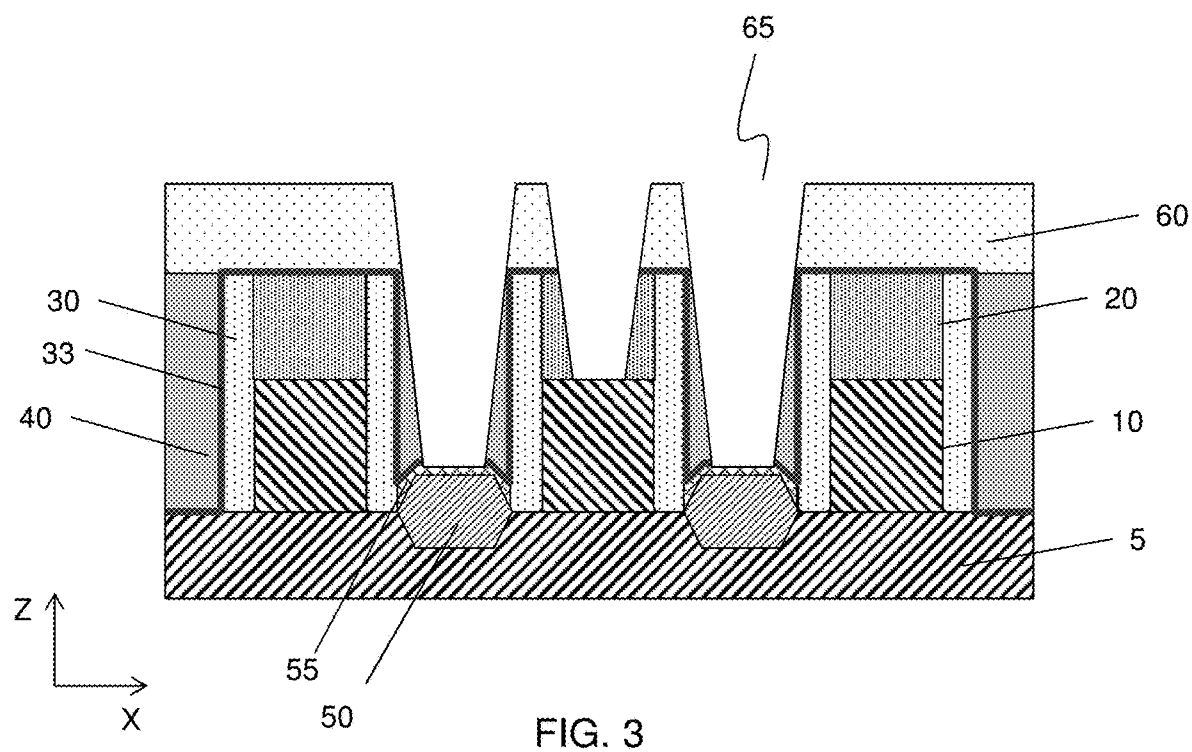

Then, as shown in FIG. 3, contact holes 65 are formed in the first and second ILD layers so as to partially expose the upper surfaces of the silicide layers 55 of the S/D regions and the metal gate 10 of the gate structure. In some embodiments, a gate silicide layer is also formed on a metal gate structure 10, and the gate silicide layer is exposed by forming a contact hole.

Figure 4:
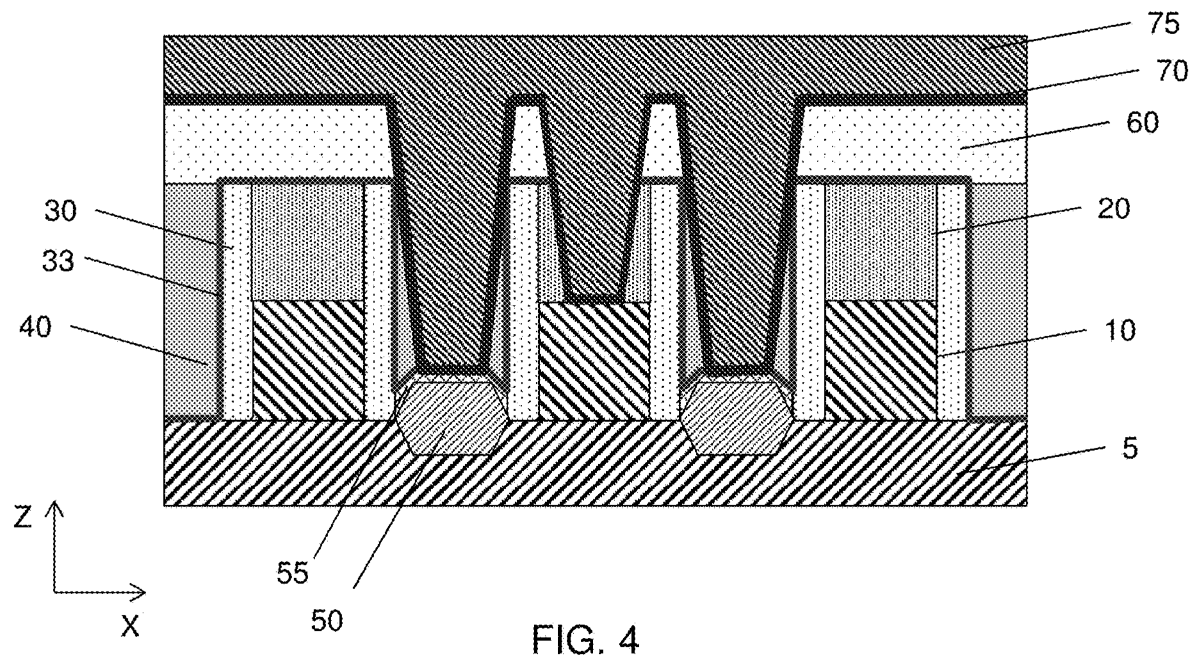

After the contact holes 65 are formed, a blanket layer of an adhesive (glue) layer 70 is formed and then a first metal layer 75 is formed to cover the entire upper surface, as shown in FIG. 4.

The adhesive layer 70 includes one or more layers of conductive materials. In some embodiments, the adhesive layer 70 includes a TiN layer formed on a Ti layer. The thickness of each of the TiN and Ti layer is in a range from about 1 nm to about 5 nm in some embodiments. The adhesive layer 70 can be formed by CVD, physical vapor deposition (PVD) including sputtering, atomic layer deposition (ALD), electro-plating or a combination thereof, or other suitable film forming methods. The adhesive layer 70 is used to prevent the first metal layer 75 from peeling off. In some embodiments, the adhesive layer 70 is not used and the first metal layer 75 is directly formed in the contact holes. In such cases, the first metal layer 75 is in direct contact with the silicide layer 55.

The first metal layer 75 is one of Co, W, Mo and Cu. In one embodiment, Co is used as the metal layer 75. The first metal layer 75 can be formed by CVD, PVD, ALD, electroplating or a combination thereof or other suitable film forming methods.

Figure 5:
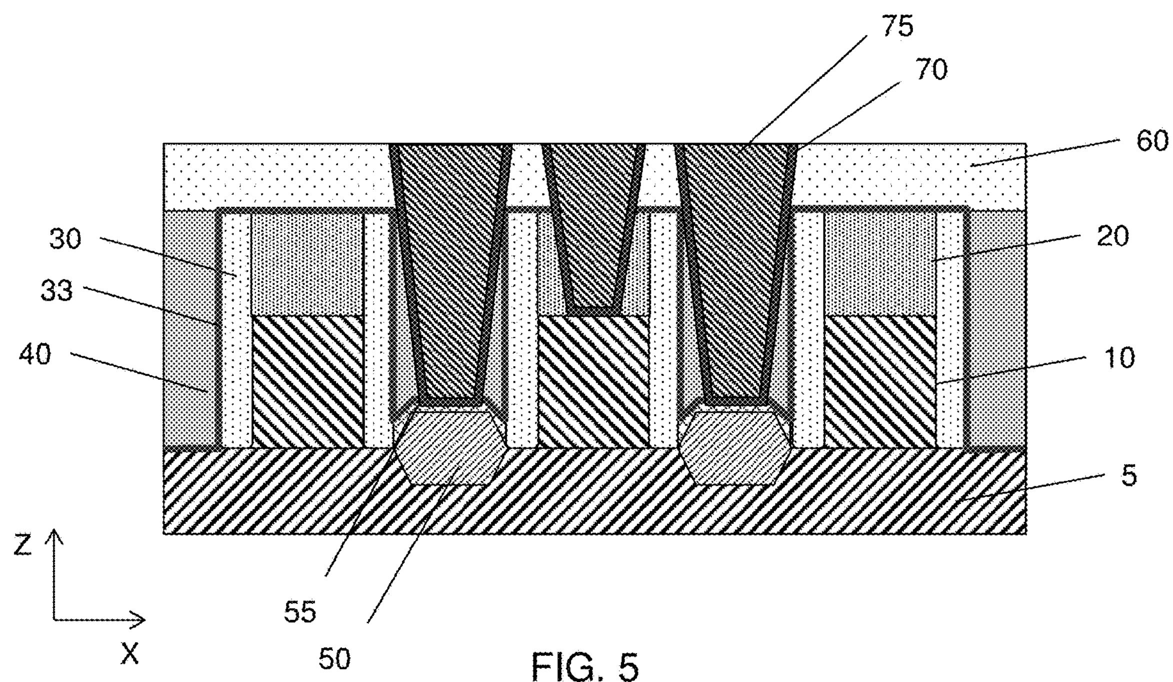

After the "thick" first metal layer is formed, a planarization operation, such as chemical mechanical polishing (CMP) or etch-back operations, is performed so as to remove the adhesive layer and the first metal layer deposited on the upper surface of the second ILD layer 60, as shown in FIG. 5.

Figure 6:
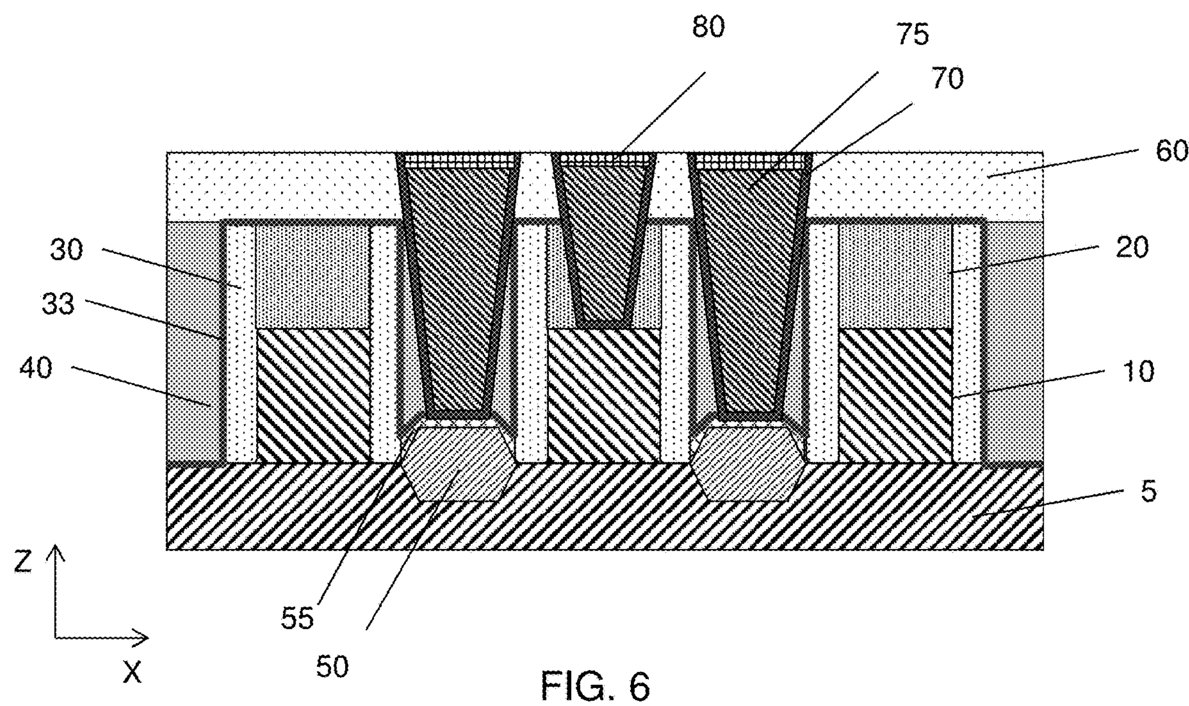

Subsequently, an upper silicide layer 80 is formed on the upper surface of the first metal layer 75, as shown in FIG. 6. In some embodiments, the silicide layer 80 contains the same metal element as the first metal layer 75. For example, if the first metal layer 75 is made of Co, silicide layer 80 is Co silicide. If the first metal layer 75 is made of W, the silicide layer 80 is W silicide. If the first metal layer 75 is made of Mo, the silicide layer 80 is Mo silicide. If the first metal layer 75 is made of Cu, the silicide layer 80 is Cu silicide.

When the first metal layer 75 is made of Co, $SiH_4$ and/or $Si_2H_6$ gas (silane source gas) together with one or more dilution gases (e.g., He, $H_2$) is introduced in a vacuum chamber where the substrate with the structure of FIG. 5 is placed. By supplying an $H_2$ gas before supplying a silane source gas, an oxide layer (e.g., $CoO_x$) on the surface of the Co layer 75 can be reduced and a clean and pure Co surface can be obtained. The silane source gas is supplied with a dilution gas such as He and/or $H_2$. By using a dilution gas of He and/or $H_2$ without using $N_2$ or other nitrogen source gas, it is possible to prevent nitridation of the Co and/or CoSi layer.

The substrate is heated at about 300° C. to about 800° C., in some embodiments. Under this condition, cobalt atoms at the surface of the first metal layer 75 react with silicon atoms from the silane source gas, thereby forming a Co silicide layer 80. In some embodiments, an additional annealing operation is performed after the Co silicide layer 80 is formed. The additional annealing is performed at a temperature in a range from about 300° C. to about 800° C. in an ambient of one or more of $H_2$, $NH_3$, He and Ar. In one embodiment, $NH_3$ is used as an annealing gas. With the foregoing operations, it is possible to obtain a hillock free CoSi layer with a surface roughness of about 0.1 nm to about 2 nm in some embodiments.

When the temperature is high, for example, about 700-800° C., $CoSi_2$ is mainly formed. When the temperature is low, for example, about 300-400° C., $Co_2Si$ is mainly formed. When the temperature is about 400-600° C., CoSi is mainly formed. It is noted that $CoSi_2$ has a lower resistivity than $Co_2Si$ or CoSi. Additional thermal operations may be performed.

Similarly, when the first metal layer 75 is made of Cu or Ti, the silicide layer 80 can be formed by using silane source gas.

In other embodiments, a thin silicon layer, e.g., a polysilicon layer or an amorphous layer, is formed over the structure of FIG. 5, and then an annealing operation is performed to form the silicide layer 80 on the first metal layer 75. In such a case, the silicon layer formed on the second ILD layer 60 is removed after the formation of the silicide layer by using wet etching.

The thickness of the silicide layer 80 is in a range from about 3 nm to about 5 nm in some embodiments.

Figure 7:
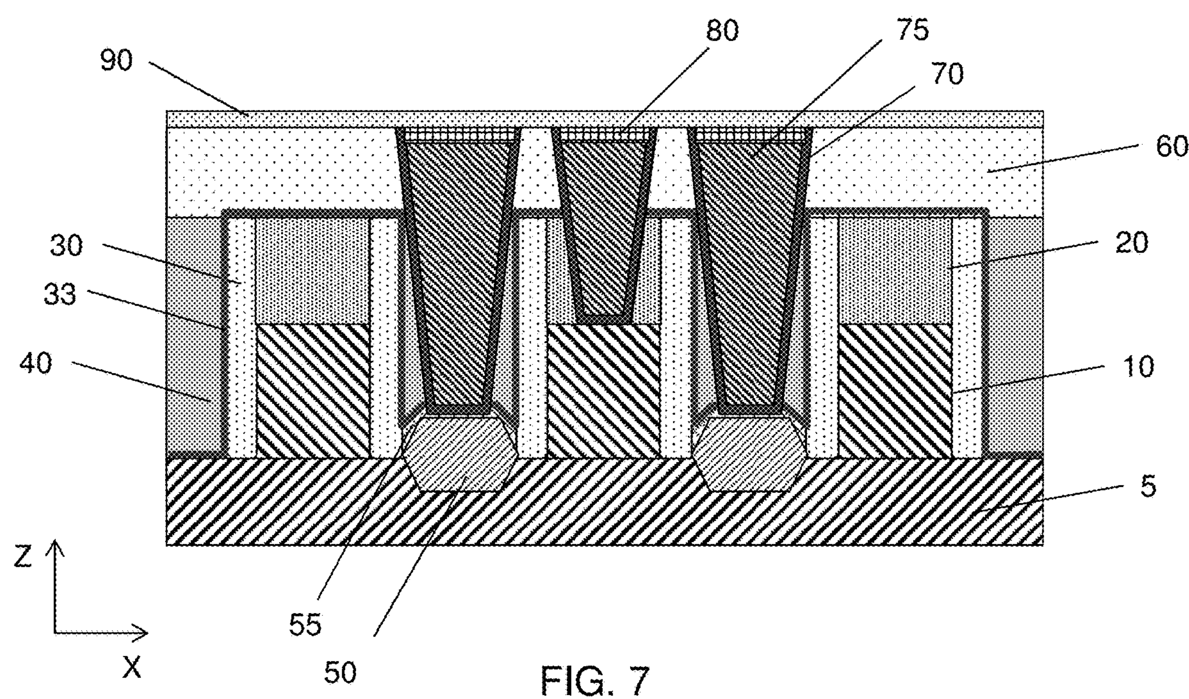

Subsequently, an ESL (etch stop layer) 90 is formed over the silicide layer 80 and the second ILD layer 60, as shown in FIG. 7. The ESL 90 includes one or more layers of SiN, SiC, SiCN or SiON. The thickness of the ESL 90 in in a range from about 10 nm to about 30 nm in some embodiments.

The ESL 90 can be formed by plasma enhanced CVD using $SiH_4$ and/or $Si_2H_6$ gas with a nitrogen source gas, such as $N_2$ or $NH_3$, a carbon source gas, such as $CH_4$ and/or oxygen source gas, such as $O_2$. Since the same silane group gas can be used, the deposition of the ESL 90 can be performed in the same vacuum chamber or the same film forming tool used for the formation of the Co silicide layer 80 by simply changing the source gases and some other conditions, such as a temperature or a pressure. In one embodiment, a nitrogen source gas, such as $NH_3$, is supplied before the ESL deposition, so that residual Si, if any, on the surface of the second ILD 60 can be formed into a dielectric material (e.g., SiN) in the formation of the ESL layer.

Figure 8:
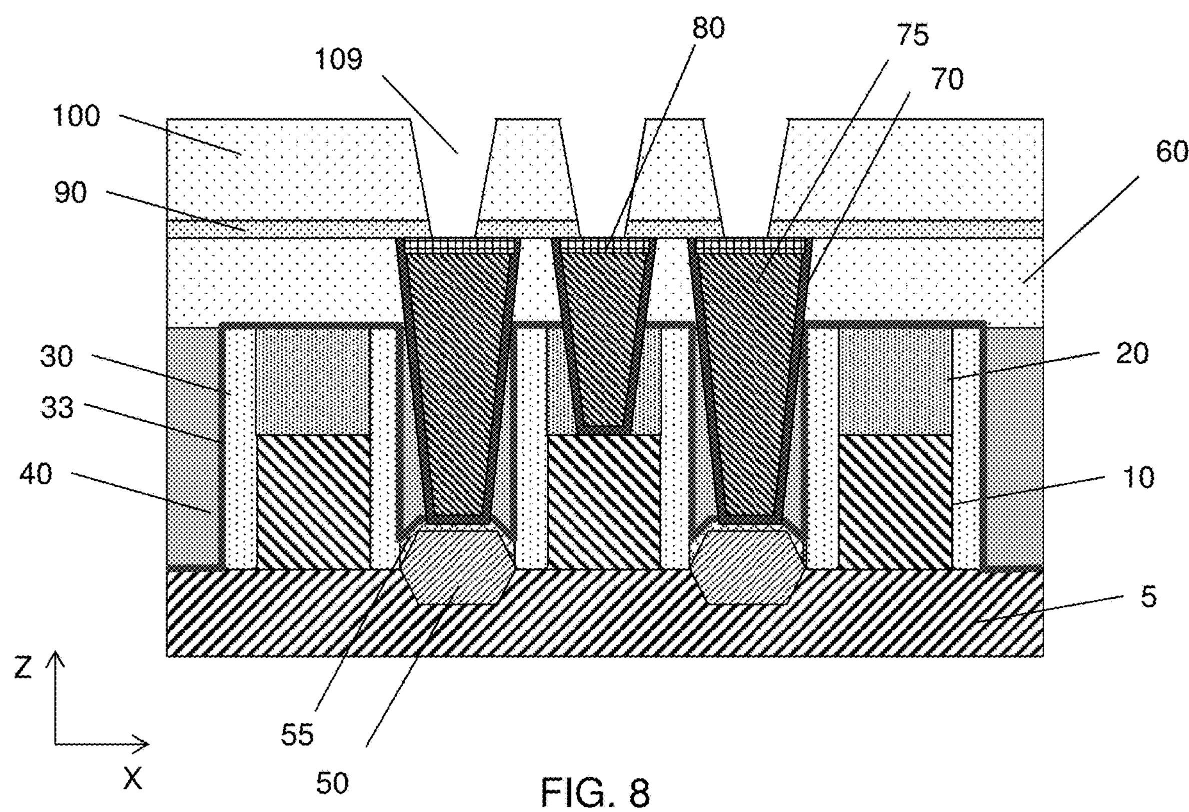

Next, as shown in FIG. 8, a third ILD layer 100 is formed over the ESL 90. The material and forming process of the third ILD 100 are similar to those of the first ILD layer 40 and/or the second ILD layer 60. Further, a contact opening 109 is formed in the third ILD layer and the ESL 90. In some embodiments, the etching operation to form the contact opening 109 stops on the silicide layer 80. In other words, the silicide layer 80 can function as an etch stop layer. In other embodiments, during the contact etching, the silicide layer 80 at the bottom of the contact opening is etched and removed.

Figure 9:
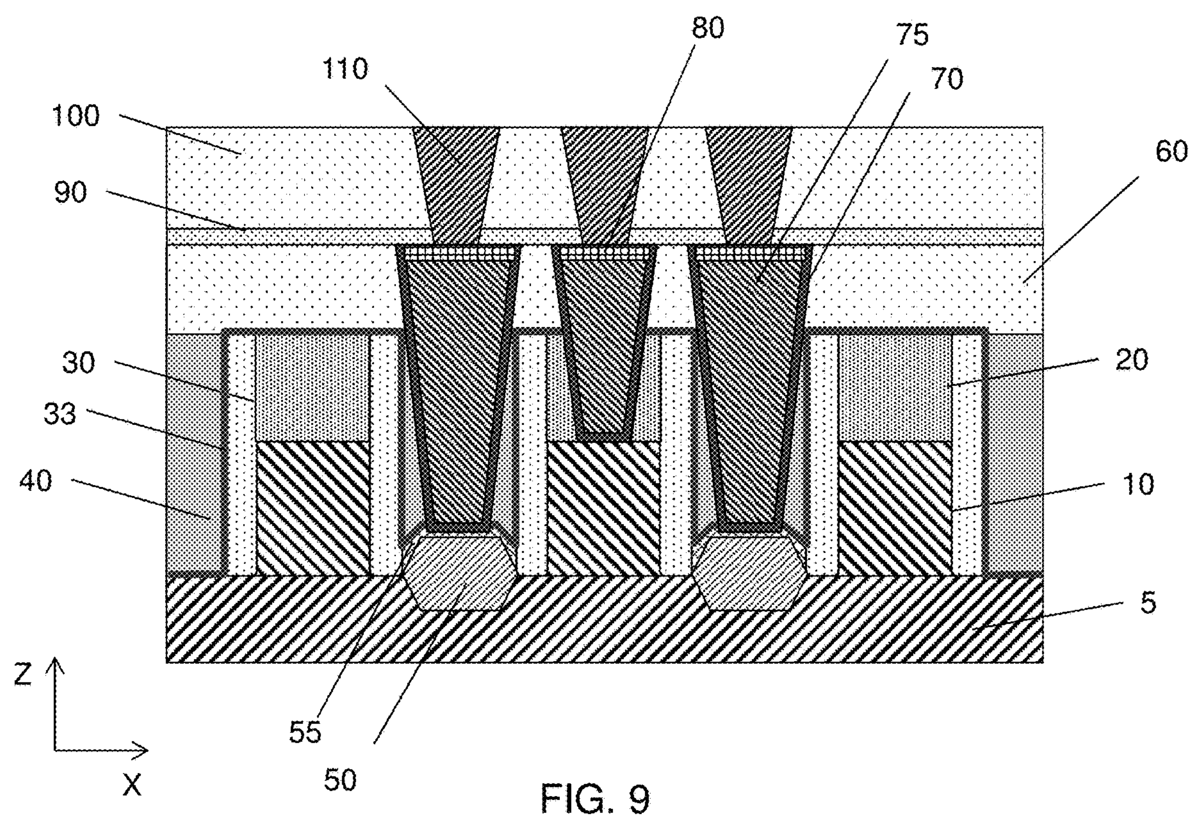

Further, a via plug 110 is formed in the contact opening 109 so as to be electrically connected to the first metal layer 75, as shown in FIG. 9. The via plug 110 includes one or more layers of conductive materials, such as TiN, Ti, Cu, Al, W or an alloy thereof or other suitable materials.

It is understood that the device shown in FIG. 9 undergoes further CMOS processes to form various features such as interconnect metal layers, dielectric layers, passivation layers, etc.

Figures 10A, 10B, 10C:
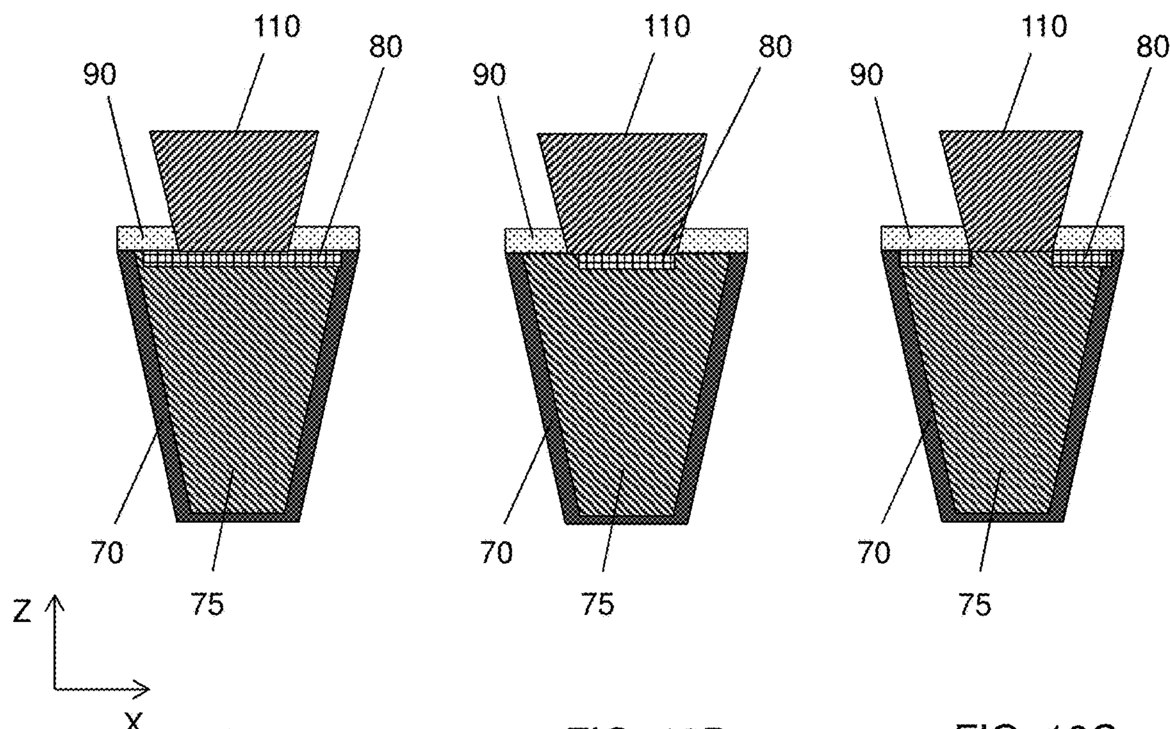
FIGS. 10A-10C show exemplary cross sectional views according to some embodiments of the present disclosure.

FIGS. 10A-10C show exemplary cross sectional views according to some embodiments of the present disclosure. FIGS. 10A-10C show only the relevant portions of the structure.

In FIG. 10A, the silicide layer 80 fully covers the upper surface of the first metal layer 75. In FIGS. 10B and 10C, unlike FIG. 10A, the silicide layer 80 only partially covers the upper surface of the first metal layer 75. In FIG. 10B, the silicide layer 80 is formed only under the via plug 110. In FIG. 10C, the silicide layer 80 is formed over the upper surface of the first metal layer 75 except for the area where the via plug 110 is formed. In some embodiments, to fabricate the structure of FIG. 10C, after the contact opening 109 is formed, the silicide layer 80 is removed, by using a plasma treatment or an ion bombardment treatment, and then, the metal material (e.g., Co) is selectively grown to fill the recess from which the silicide is removed.

Figures 11A, 11B, 11C:
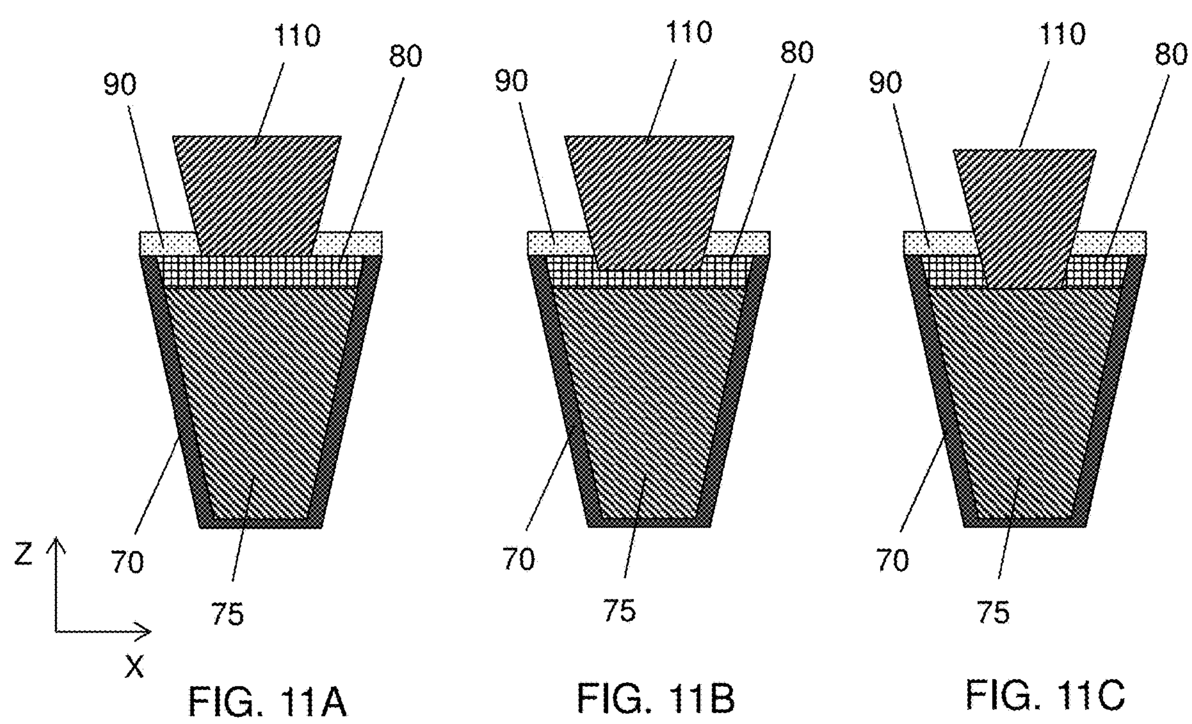
FIGS. 11A-11C show exemplary cross sectional views according to some embodiments of the present disclosure.

FIGS. 11A-11C show exemplary cross sectional views according to some embodiments of the present disclosure. FIGS. 11A-11C show only the relevant portions of the structure.

Depending on the contact etching conditions (e.g., over etching conditions) for forming a contact opening 109, the location of the bottom of the via plug varies. In FIG. 11A, the bottom of the via plug 110 is located at the upper surface of the silicide layer 80. In FIG. 11B, the bottom of the via plug 110 is located at a middle of the silicide layer 80 in the Z direction. In other words, the via plug 110 is partially embedded in the silicide layer 80. In FIG. 10C, the bottom of the via plug 110 is in contact with the upper surface of the first metal layer 75. In other words, the via plug 110 passes through the silicide layer 80.

Figure 12:
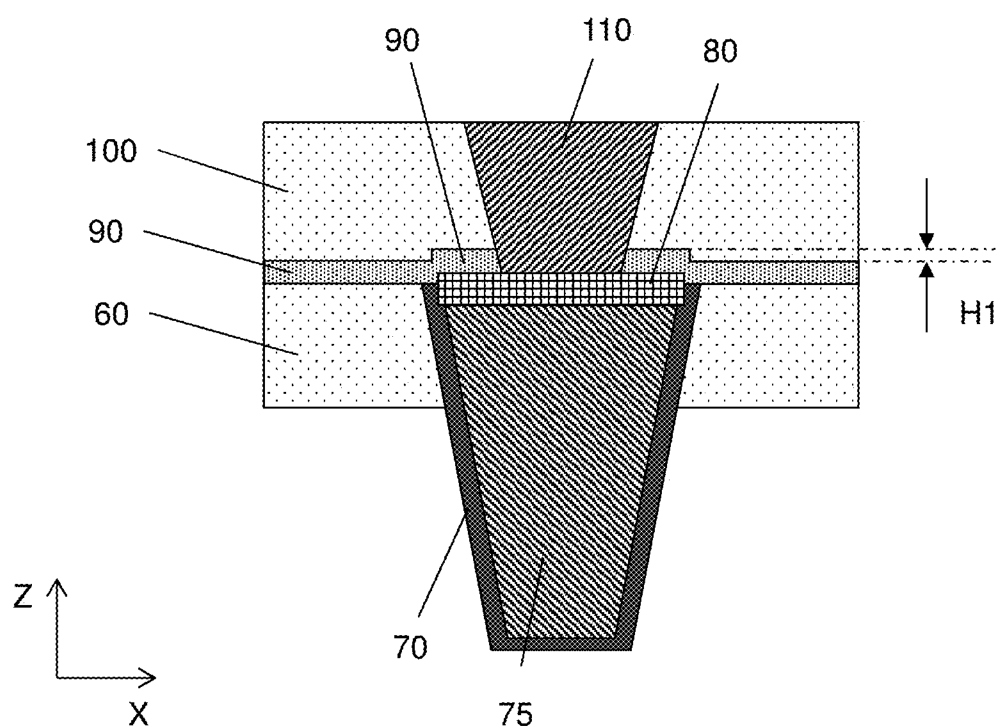
FIG. 12 shows an exemplary cross sectional view according to another embodiment of the present disclosure.

FIG. 12 shows an exemplary cross sectional view according to another embodiment of the present disclosure. FIG. 12 shows only the relevant portions of the structure.

In FIG. 12, a relatively thick silicide layer 80 is formed. The thickness of the silicide layer 80 is in a range from about 5 nm to about 10 nm in some embodiments. As shown in FIG. 12, the silicide layer 80 protrudes above the upper surface of the second ILD layer 60. Accordingly, the CESL 90 has a raised step. The difference H1 of the level of the upper surface of the CESL 90 above the second ILD layer and the level of the upper surface of the CESL 90 above the silicide layer 80 is in a range from about 0.5 nm to about 4 nm in some embodiments.

Figure 13:
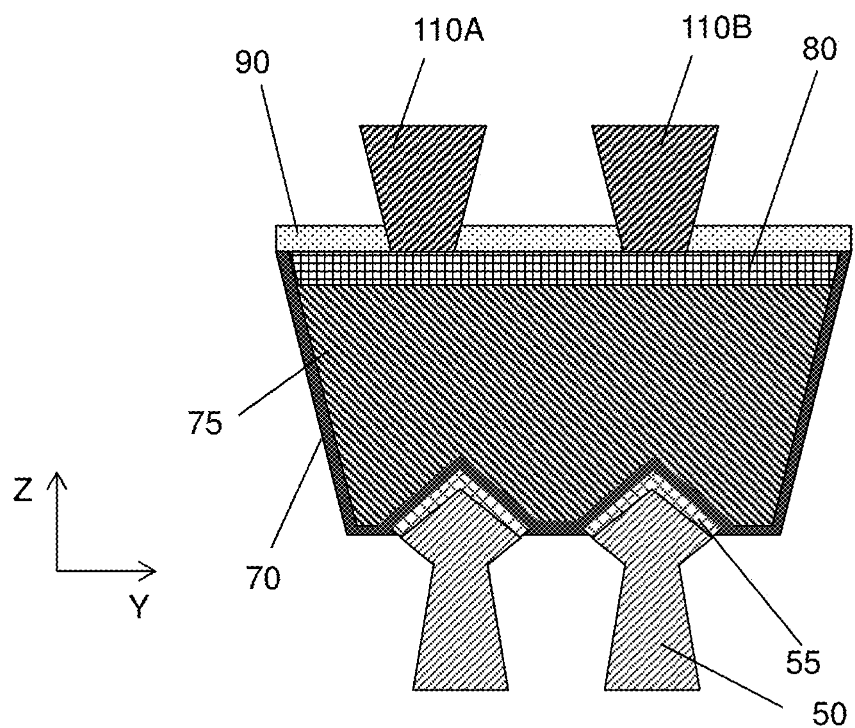
FIG. 13 shows an exemplary cross sectional view according to another embodiment of the present disclosure.

FIG. 13 show an exemplary cross sectional view according to another embodiment of the present disclosure. In some embodiments, the first metal layer has a substantially rectangular shape elongating in, for example, the Y direction in plan view. In such cases, two (110A and 110B) or more via plugs are disposed over the first metal layer 75, as shown in FIG. 13.

FIGS. 14-17 show exemplary cross sectional views corresponding to line X1-X1 of FIG. 1A illustrating various stages of the sequential fabrication process of a semiconductor device according to another embodiment of the present disclosure. It is understood that additional operations can be provided before, during, and after processes shown by FIGS. 14-17, and some of the operations described below can be replaced or eliminated for additional embodiments of the method. The order of the operations/processes may be interchangeable. The same or similar structures, configurations, materials and/or processes as the foregoing embodiments may be employed in the following embodiments, and the detailed explanations may be omitted.

Figure 14:
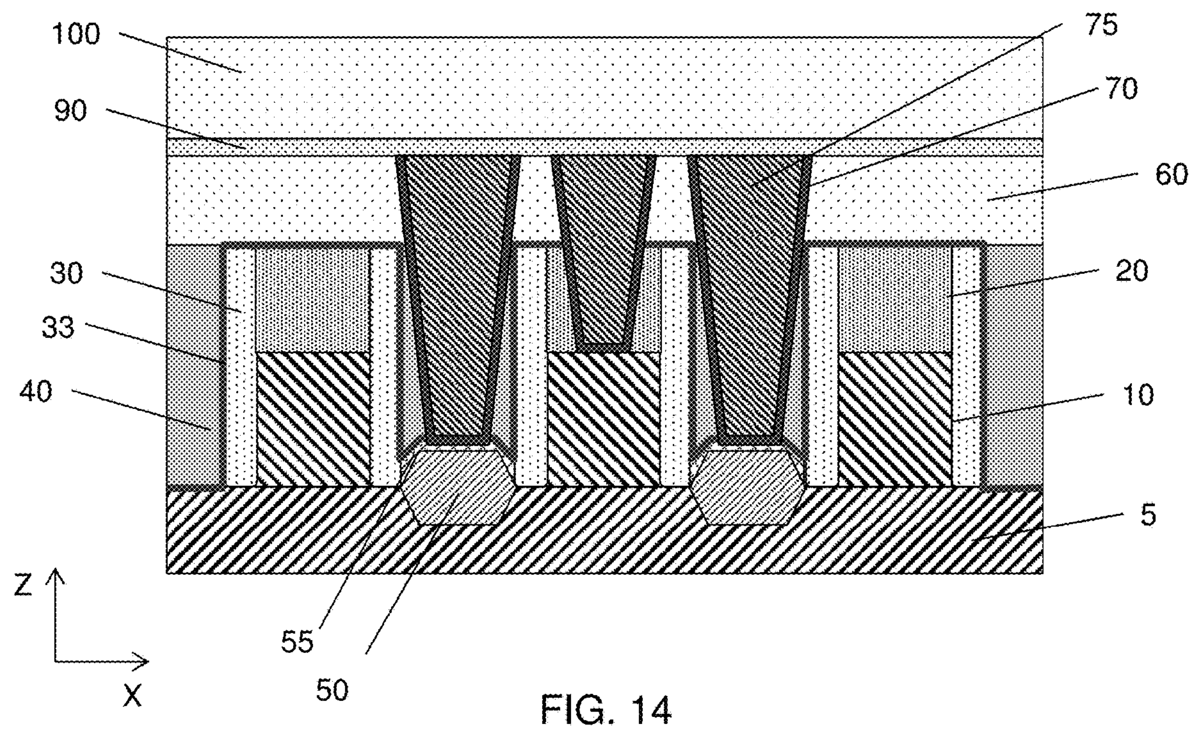
FIGS. 14-17 show exemplary cross sectional views corresponding to line X1-X1 of FIG. 1A illustrating various stages of the sequential fabrication process of a semiconductor device according to another embodiment of the present disclosure.
Figure 15:
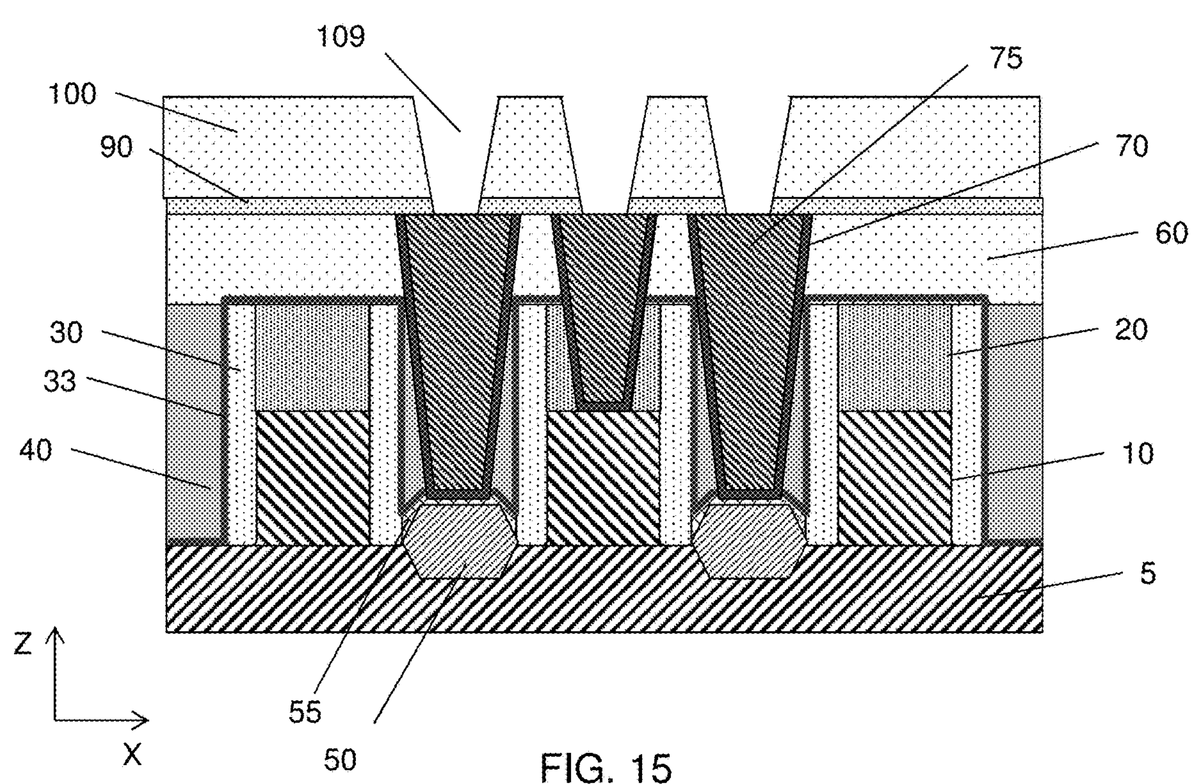
Figure 16:
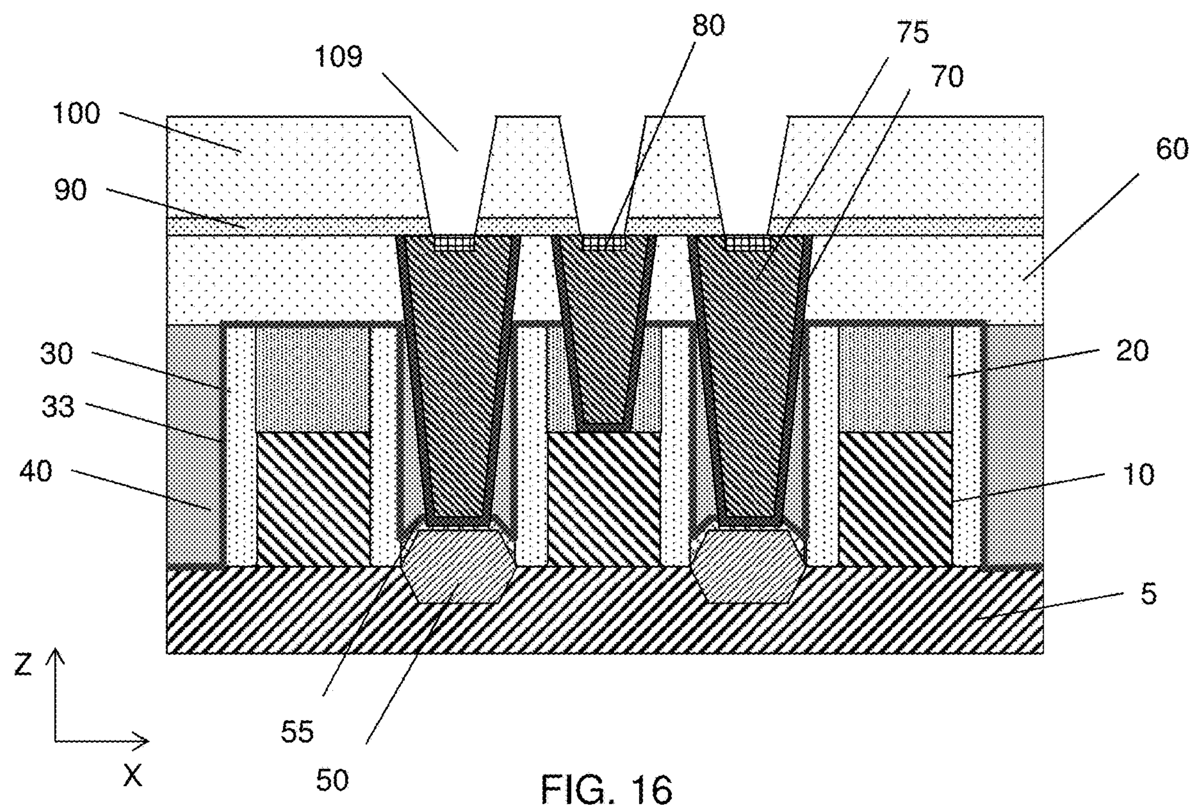

Unlike the structures and processes of FIGS. 6 and 7, the CSEL 90 and the third ILD layer 100 are formed over the structure of FIG. 5 without forming a silicide layer over the first metal layer 75, as shown in FIG. 14. Further, a contact opening 109 is formed in the third ILD layer 100 and the CESL 90, so as to expose a part of the upper surface of the first metal layer 75, as shown in FIG. 15.

Then, a silicide layer 80 is formed on the upper surface of the first metal layer 75 at the bottom of the contact opening 109. The similar silicide formation operations as described above can be utilized.

Figure 17:
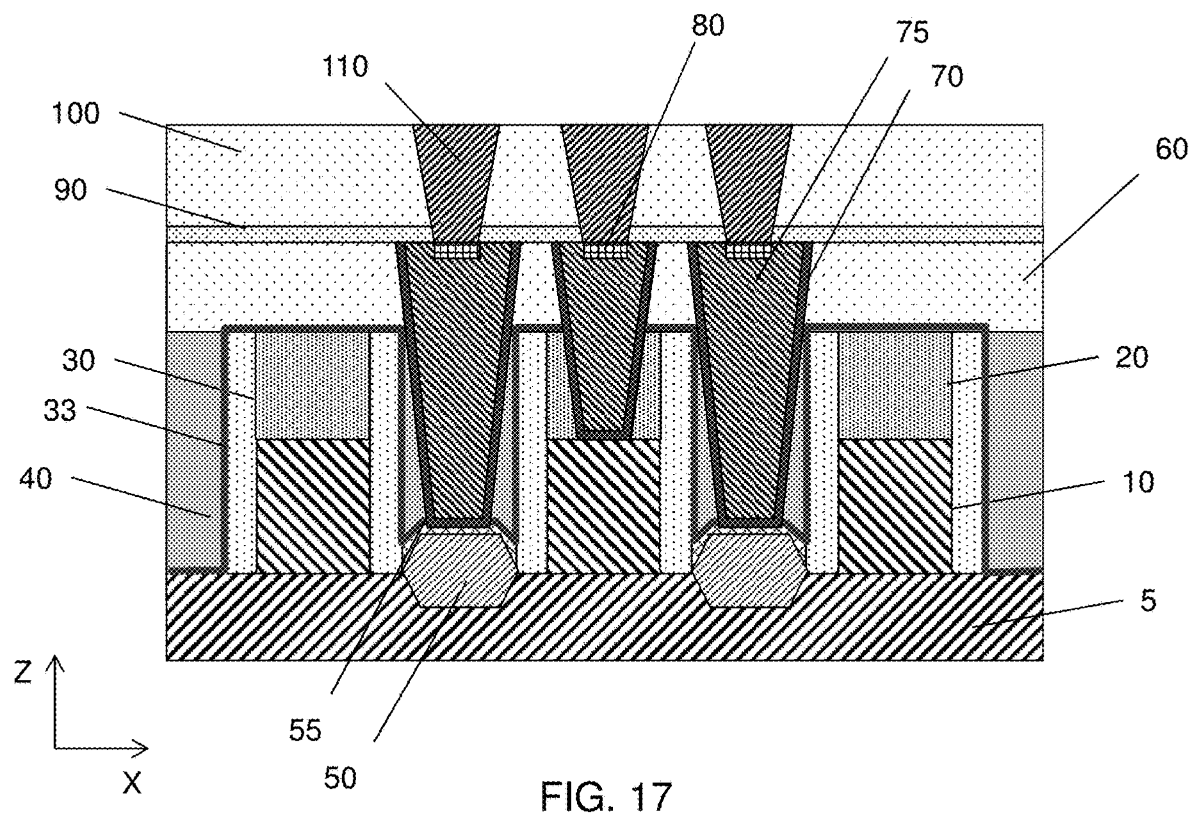

Subsequently, a via plug 110 is formed in the contact opening 109, as shown in FIG. 17. In FIG. 17, similar to FIG. 10B, the silicide layer 80 is formed only under the via plug 110. In some embodiments, the thickness of CESL 90 is as thick as or more than half of the height of the via plug 110.

FIGS. 18-21 show exemplary cross sectional views corresponding to line X1-X1 of FIG. 1A illustrating various stages of the sequential fabrication process of a semiconductor device according to another embodiment of the present disclosure. It is understood that additional operations can be provided before, during, and after processes shown by FIGS. 18-21, and some of the operations described below can be replaced or eliminated for additional embodiments of the method. The order of the operations/processes may be interchangeable. The same or similar structures, configurations, materials and/or processes as the foregoing embodiments may be employed in the following embodiments, and the detailed explanations may be omitted.

Figure 18:
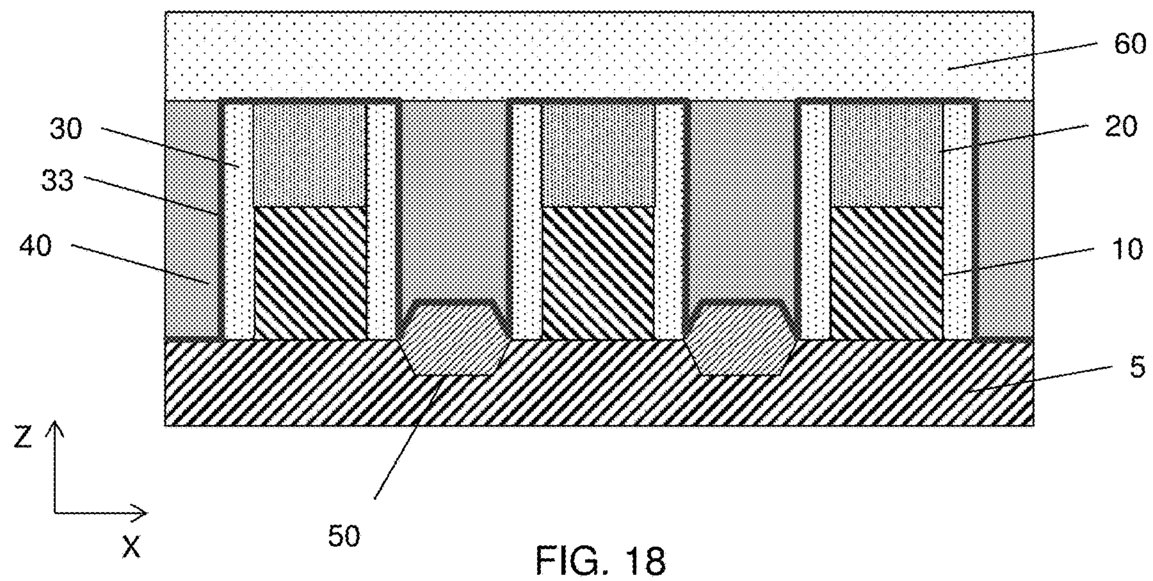
FIGS. 18-21 show exemplary cross sectional views corresponding to line X1-X1 of FIG. 1A illustrating various stages of the sequential fabrication process of a semiconductor device according to another embodiment of the present disclosure.
Figure 19:
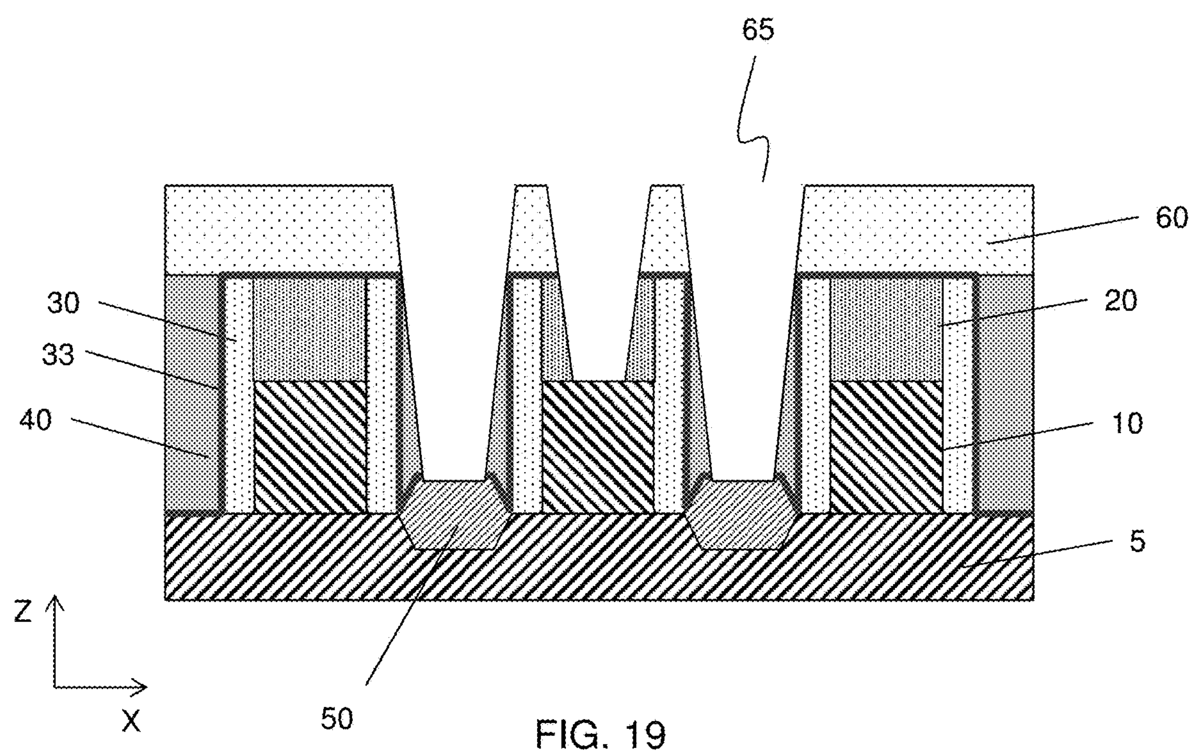

In the foregoing embodiments, a silicide layer 55 is formed before the CESL 33 is formed and the contact holes 65 are formed, as shown in FIGS. 2 and 3. In the following embodiments, as shown in FIG. 18, a CESL 33 is formed without forming a silicide layer over the source/drain (S/D) regions 50. Then, as shown in FIG. 19. Contact holes 65 are formed to expose part of the S/D regions 50.

Figure 20:
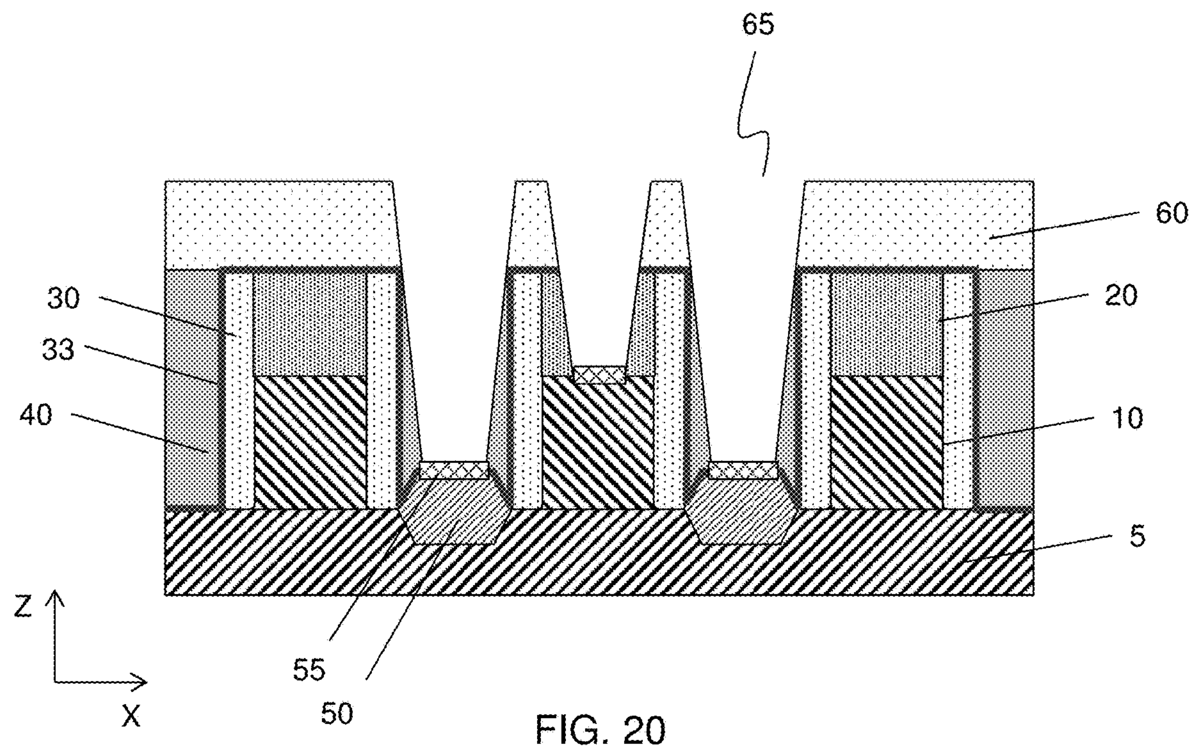
Figure 21:
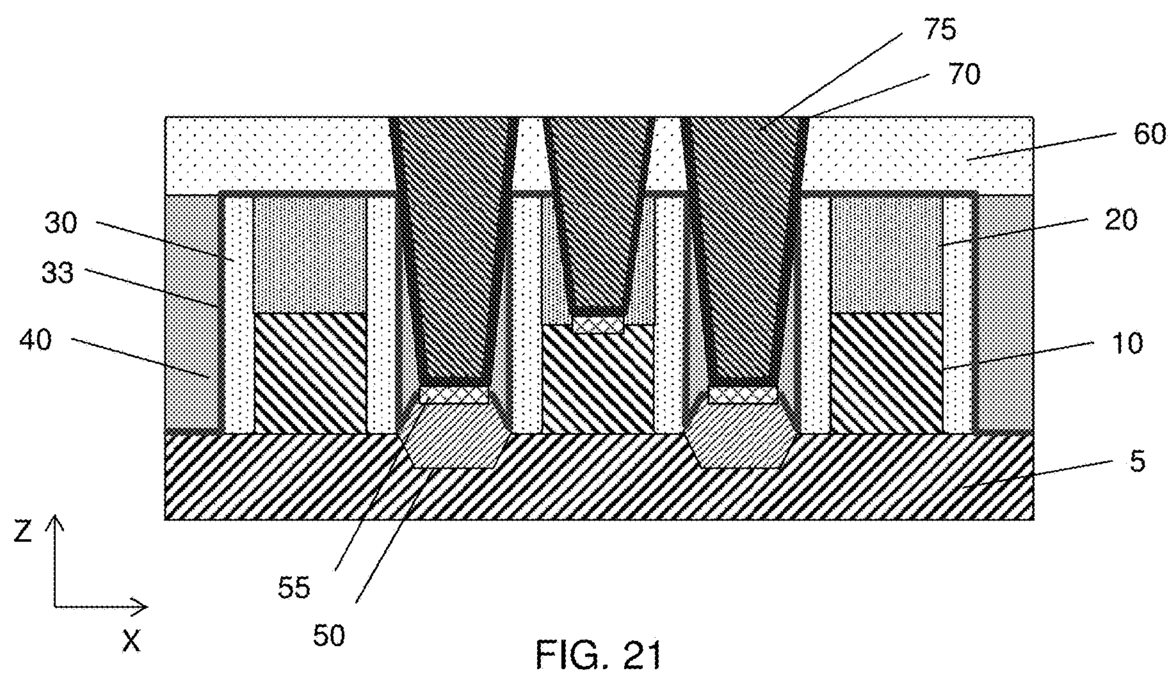

Subsequently, a silicide layer 55 is formed over the S/D region 50, as shown in FIG. 20. By using similar operations to FIGS. 4 and 5, an optional adhesive layer 70 and a first metal layer 75 are formed as shown in FIG. 21. As shown in FIG. 21, the silicide layer 55 is formed only at the interface between the S/D region 50, and the CESL 33 is in direct contact with the S/D region 50.

The silicide layer 50 is also formed at the bottom of a contact hole over the metal gate structures 10 as shown in FIG. 20.

After the structure shown in FIG. 21 is formed, the operations explained in the foregoing embodiments to form via plugs 110 are performed.

The various embodiments or examples described herein offer several advantages over the existing art. For example, in the present disclosure, since a silicide layer (e.g., Co silicide) is formed on the surface of the first metal layer (e.g., Co), the silicide layer functions as a passivation layer that can protect the underlying metal layer (e.g., Co) from being oxidized or damaged in air or during subsequent manufacturing operations. In addition, the silicide layer can function as an etch stop layer when the contact opening for a via plus is formed, thereby preventing the via from passing to the underlying layer. Further, the silicide layer can be selectively formed on the surface of the first metal layer, and the silicide layer and the CESL can be formed in the same vacuum chamber or the same film deposition tool. With these features, it is possible to prevent a current leakage. If a Si layer is deposited on the whole wafer and converted into the silicide layer, the remaining Si may cause leakage between the first metal layers.

It will be understood that not all advantages have been necessarily discussed herein, no particular advantage is required for all embodiments or examples, and other embodiments or examples may offer different advantages.

According to one aspect of the present disclosure, in a method of manufacturing a semiconductor device, a first contact hole is formed in one or more dielectric layers disposed over a source/drain region or a gate electrode. An adhesive layer is formed in the first contact hole. A first metal layer is formed on the adhesive layer in the first contact hole. A silicide layer is formed on an upper surface of the first metal layer. The silicide layer includes a same metal element as the first metal layer.

According to another aspect of the present disclosure, in a method of manufacturing a semiconductor device, a first contact hole is formed in one or more dielectric layers disposed over a source/drain region or a gate electrode. A first metal layer is formed in the first contact hole. An upper silicide layer is formed on an upper surface of the first metal layer. At least one of the source/drain region and the gate electrode includes a lower silicide layer. The first metal layer is in contact with the lower silicide layer. The upper silicide layer at least partially covers the upper surface of the first metal layer. The upper silicide layer includes a same metal element as the first metal layer.

In accordance with yet another aspect of the present disclosure, a semiconductor device including a field effect transistor, includes a source/drain region, a source/drain silicide layer formed on the source/drain region, and a first contact connected to the source/drain silicide layer. The first contact includes a first metal layer. An upper surface of the first metal layer is at least covered by a silicide layer. The silicide layer includes a same metal element as the first metal layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device including a field effect transistor, comprising:
- a source/drain region;
- a source/drain silicide layer formed on the source/drain region;
- a first contact disposed in the interlayer dielectric layer over the source/drain silicide layer; and
- a second contact disposed over the first contact, wherein:
- the first contact includes a first metal layer,
- an upper surface of the first metal layer is partially covered by a silicide layer,
- the silicide layer includes a same metal element as the first metal layer,
- a bottom of the second contact is in direct contact with the first metal layer and is located above a bottom surface of the silicide layer.

2. The semiconductor device of claim 1, wherein:
- the first contact further includes an adhesive layer, and
- the adhesive layer is disposed between the first metal layer and the source/drain silicide layer.

3. The semiconductor device of claim 1, further comprising a dielectric layer, in which the first contact is embedded, wherein the silicide layer protrudes above an upper surface of dielectric layer.

4. The semiconductor device of claim 1, wherein the silicide layer is made of Co silicide and the first metal layer is made of Co.

5. The semiconductor device of claim 1, further comprising:
- a dielectric layer, in which the first contact is embedded; and
- an insulating layer in contact with the silicide layer and the dielectric layer,
- wherein the insulating layer is made of a different material than the dielectric layer.

6. The semiconductor device of claim 1, wherein the bottom of the second contact is in contact with the upper surface of the first metal layer.

7. A semiconductor device including a field effect transistor, comprising:
- a first interlayer dielectric layer;
- a first contact including a first metal layer, embedded in the first interlayer dielectric layer and disposed over an underlying conductive layer;
- an adhesive layer disposed between the first contact and the underlying conductive layer;
- a first silicide layer partially covering an upper surface of the first metal layer;
- an insulating layer disposed over the first interlayer dielectric layer;
- a second interlayer dielectric layer disposed over the insulating layer; and
- a second contact embedded in the second interlayer dielectric layer and in contact with at least one of the silicide layer and the first contact, wherein:
- the silicide layer is made of Co silicide and the first metal layer is made of Co, and
- a bottom of the second contact is in contact with the first metal layer.

8. The semiconductor device of claim 7, wherein the bottom of the second contact is in contact with the upper surface of the first metal layer.

9. The semiconductor device of claim 8, wherein the insulating layer is in contact with a part of the upper surface of the first metal layer.

10. The semiconductor device of claim 9, wherein the silicide layer is in contact with the insulating layer.

11. The semiconductor device of claim 9, wherein the silicide layer is in contact with the adhesive layer.

12. The semiconductor device of claim 7, wherein the bottom of the second contact is located above a bottom surface of the silicide layer.

13. The semiconductor device of claim 7, wherein the insulating layer is made of a different material than the first and second interlayer dielectric layers.

14. The semiconductor device of claim 13, wherein the insulating layer includes at least one selected from the group consisting of SiN, SiC, SiCN and SiON.

15. A semiconductor device including a field effect transistor, comprising:

a first contact disposed over a conductive portion formed over a substrate and embedded in an interlayer dielectric layer;

an adhesive layer disposed between the interlayer dielectric layer and the first contact; and a second contact disposed over the first contact, wherein:

the first contact includes a first metal layer, an upper surface of the first metal layer is partially covered by a silicide layer, the silicide layer includes a same metal element as the first metal layer, and the bottom of the second contact is in direct contact with and the first metal layer and is located above a bottom surface of the silicide layer.

16. The semiconductor device of claim 15, wherein a bottom of the second contact is in contact with the first metal layer.

17. The semiconductor device of claim 16, wherein the bottom of the second contact is located above an upper surface of the silicide layer.

18. The semiconductor device of claim 15, wherein the adhesive layer includes a TiN layer formed on a Ti layer.

19. The semiconductor device of claim 15, wherein the adhesive layer is in contact with the silicide layer.

20. The semiconductor device of claim 15, wherein the silicide layer is made of Co silicide and the first metal layer is made of Co.

* * * * *